US012751251B2

(12) United States Patent
Inoue et al.

(10) Patent No.: US 12,751,251 B2
(45) Date of Patent: Sep. 29, 2026

(54) METHOD OF MANUFACTURING LAMINATED ASSEMBLY

(71) Applicants: DISCO CORPORATION, Tokyo (JP); YOKOHAMA NATIONAL UNIVERSITY, Yokohama (JP)

(72) Inventors: Fumihiro Inoue, Yokohama (JP); Shunsuke Teranishi, Tokyo (JP); Akihito Kawai, Tokyo (JP); Naoko Yamamoto, Tokyo (JP)

(73) Assignees: DISCO CORPORATION, Tokyo (JP); YOKOHAMA NATIONAL UNIVERSITY, Yokohama (JP)

( * ) Notice: Subject to any disclaimer, the term of this patent is extended or adjusted under 35 U.S.C. 154(b) by 348 days.

(21) Appl. No.: 18/662,007

(22) Filed: May 13, 2024

(65) Prior Publication Data

US 2024/0387229 A1 Nov. 21, 2024

(30) Foreign Application Priority Data

May 17, 2023 (JP) ................................ 2023-081568

(51) Int. Cl.
*H10P 72/70* (2026.01)
*H10W 72/00* (2026.01)
*H10W 80/00* (2026.01)

(52) U.S. Cl.
CPC .......... *H10P 72/74* (2026.01); *H10P 72/7412* (2026.01); *H10P 72/744* (2026.01); *H10W 72/0198* (2026.01); *H10W 80/211* (2026.01); *H10W 80/312* (2026.01); *H10W 80/327* (2026.01)

(58) Field of Classification Search
CPC .. H10W 80/211; H10W 80/327; H10P 72/744
See application file for complete search history.

(56) References Cited

U.S. PATENT DOCUMENTS

2014/0175637 A1* 6/2014 Stuber ...................... H10P 54/00
257/737
2017/0292198 A1* 10/2017 Mitsushima .............. C25B 9/23

FOREIGN PATENT DOCUMENTS

JP 2012134231 A 7/2012

* cited by examiner

*Primary Examiner* — Steven M Page
(74) *Attorney, Agent, or Firm* — GREER BURNS & CRAIN, LTD.

(57) ABSTRACT

A method of manufacturing a laminated assembly includes depositing an oxide film on each of one surface of a plate-shaped object and a temporary joint surface of a temporary support substrate in an atmosphere whose temperature is kept in a first temperature range, performing a hydrophilizing process on an exposed surface of the oxide film, temporarily joining the plate-shaped object and the temporary support substrate with the oxide film interposed therebetween, forming a joint member on a joint surface of a support substrate, joining the plate-shaped object and the support substrate to each other with the joint member interposed therebetween, vaporizing water contained in the oxide film in an atmosphere whose temperature is kept in a second temperature range higher than the first temperature range, and separating the plate-shaped object and the temporary support substrate from each other.

5 Claims, 10 Drawing Sheets

METHOD OF MANUFACTURING LAMINATED ASSEMBLY

BACKGROUND OF THE INVENTION

Field of the Invention

The present invention relates to a method of manufacturing a laminated assembly including a plate-shaped object having one surface and another surface positioned opposite the one surface.

Description of the Related Art

The development of three-dimensional packaging technologies including chip-on-chip (CoC), chip-on-wafer (CoW), and wafer-on-wafer (WoW) packaging processes has been in progress for a purpose of producing highly integrated semiconductor device packages. According to the Cow packaging process, for example, a plurality of chips are joined to a wafer as a support substrate, and then the support substrate is divided along boundaries between the chips, thereby fabricating semiconductor device packages (see, for example, JP 2012-134231A).

SUMMARY OF THE INVENTION

If a plurality of chips are joined one by one to a support substrate, then the joining process is time-consuming. In view of such a drawback, there has been proposed a technology referred to as collective die to wafer bonding (Co-D2W). According to Co-D2W, specifically, a plurality of chips are temporarily joined to another wafer, i.e., a temporary support substrate, that is different from a wafer as a support substrate, and then joined all together to the support substrate. After the chips have been joined to the support substrate, the temporary support substrate is separated from the chips.

According to Co-D2W, the chips and the temporary support substrate are temporarily joined to each other using a layer of organic adhesive that is relatively thick, e.g., of a thickness of approximately 30 μm. Specifically, while the chips are being disposed in desired positions on the temporary support substrate with the layer of organic adhesive interposed therebetween, the layer of organic adhesive is cured to temporarily join the chips to the temporary support substrate.

However, when the organic adhesive is cured, it shrinks. Therefore, the chips as they are temporarily joined to the temporary support substrate may be shifted from their desired positions thereon. It would possibly be difficult to join the chips thus positionally shifted to the support substrate at their desired positions thereon.

Furthermore, when the chips and the temporary support substrate are temporarily joined to each other by the relatively thick layer of organic adhesive, the chips temporarily joined to the temporary support substrate may become different in their heights. For joining the chips that have been temporarily joined to the temporary support substrate at the different heights to the support substrate, it is necessary to press the chips and the support substrate strongly against each other. As a result, as the chips and the support substrate are joined to each other, the chips tend to move further, making it difficult for them to be joined to the support substrate at their respective desired positions thereon.

In addition, since the organic adhesive has strong bonding power, it is not necessarily easy to separate the chips and the temporary support substrate that have been temporarily joined to each other. After the temporary support substrate has been separated from the chips, at least part of the organic adhesive is liable to remain on the chips. The residues of the organic adhesive on the chips are likely to act as contaminants that tend to weaken the performance of semiconductor devices incorporated in the chips.

It has been the general practice to clean the chips to remove the organic adhesive residues therefrom after the temporary support substrate has been separated from the chips. However, the cleaning process is liable to take a long time. As a consequence, the process of manufacturing a laminated assembly including a plurality of plate-shaped objects such as chips and a support substrate to which the plate-shaped objects are joined is likely to be time-consuming.

In view of the above problems, it is an object of the present invention to provide a method of manufacturing a laminated assembly by temporarily joining a plurality of plate-shaped objects and a temporary support substrate to each other without using an organic adhesive, joining the plate-shaped objects and a support substrate to each other, and thereafter separating the temporary support substrate from the plate-shaped objects, in which the method allows the temporary support substrate to be easily separated from the plate-shaped objects.

In accordance with an aspect of the present invention, there is provided a method of manufacturing a laminated assembly including a plate-shaped object having one surface and another surface positioned opposite the one surface. The method includes a depositing step of depositing an oxide film on at least one of the one surface of the plate-shaped object or a temporary joint surface of a temporary support substrate in an atmosphere whose temperature is kept in a first temperature range, after the depositing step, a hydrophilizing step of performing a hydrophilizing process on an exposed surface of the oxide film, after the hydrophilizing step, a temporarily joining step of temporarily joining the plate-shaped object and the temporary support substrate with the oxide film interposed therebetween by placing the one surface of the plate-shaped object and the temporary joint surface of the temporary support substrate in facing relation to each other with the oxide film interposed therebetween and bringing the confronting surfaces of the plate-shaped object and the temporary support substrate closely to each other, a joint member forming step of forming a joint member on at least one of the other surface of the plate-shaped object or a joint surface of a support substrate, after the temporarily joining step and the joint member forming step, a joining step of joining the plate-shaped object and the support substrate to each other with the joint member interposed therebetween by placing the other surface of the plate-shaped object and the joint surface of the support substrate in facing relation to each other with the joint member interposed therebetween and bringing the confronting surfaces of the plate-shaped object and the support substrate closely to each other, after the joining step, a vaporizing step of vaporizing water contained in the oxide film in an atmosphere whose temperature is kept in a second temperature range higher than the first temperature range, and after the vaporizing step, a separating step of separating the plate-shaped object and the temporary support substrate from each other.

Preferably, the first temperature range is a temperature range from 80° C. to 300° C. Preferably, the second temperature range is a temperature range from 200° C. to 350° C. Preferably, the method of manufacturing a laminated assembly further includes after the depositing step and before the hydrophilizing step, a preliminarily vaporizing step of vaporizing part of the water contained in the oxide film in an atmosphere whose temperature is kept in a third temperature range that is higher than the first temperature range and lower than the second temperature range. In addition, preferably, the oxide film has a thickness up to 1 μm.

According to the present invention, the plate-shaped object is temporarily joined to the temporary support substrate using the oxide film whose exposed surface has been hydrophilized. In other words, the plate-shaped object and the temporary support substrate are temporarily joined to each other using a hydrogen bonding that occurs on the exposed surface of the oxide film, without using an organic adhesive.

According to the present invention, moreover, after the joining of the plate-shaped object and the support substrate has been completed, water contained in the oxide film is vaporized by keeping the temperature of the atmosphere higher than the temperature of the atmosphere in which to deposit the oxide film. The vaporization of water produces a number of voids in the oxide film that will act as separation initiating points where the temporary support substrate starts to be separated from the plate-shaped object. As a consequence, the method according to the present invention makes it easy to separate the temporary support substrate from the plate-shaped object.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
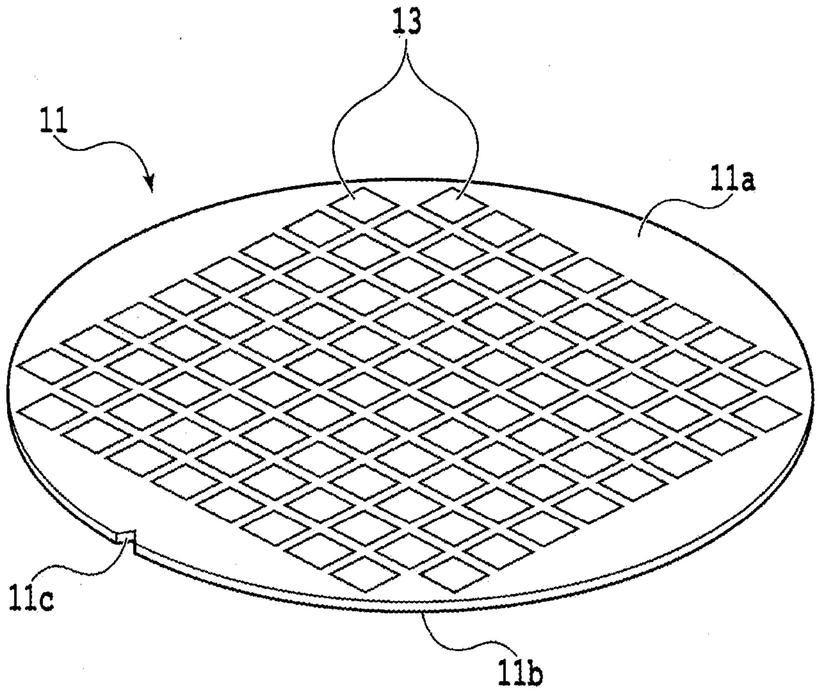
FIG. 1A is a perspective view schematically illustrating a wafer by way of example.
Figure 1B:
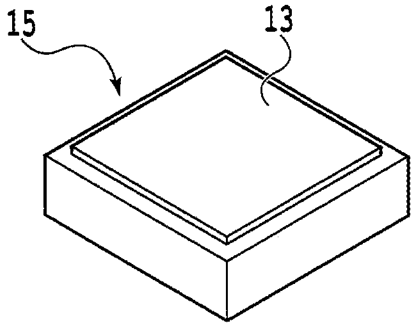
FIG. 1B is a perspective view schematically illustrating by way of example a chip to be manufactured from the wafer illustrated in FIG. 1A.

A preferred embodiment of the present invention will be described in detail below with reference to the accompanying drawings. FIG. 1A schematically illustrates a wafer by way of example in perspective, and FIG. 1B schematically illustrates by way of example in perspective a chip to be manufactured from the wafer illustrated in FIG. 1A. The wafer, denoted by 11 in FIG. 1A, includes a face side 11*a* and a reverse side 11*b* that lie generally parallel to each other, and is made of a semiconductor material such as monocrystalline silicon.

The wafer 11 has a notch 11*c* defined in an outer edge thereof as an indicator of a particular crystal orientation of the semiconductor material that the wafer 11 is made of. A plurality of devices 13 are constructed on a face side 11*a* of the wafer 11. The devices 13 are arrayed in a matrix. In other words, the devices 13 are arranged in a rectangular array of areas demarcated by a grid of boundaries. The wafer 11 will be divided along the boundaries into a plurality of chips 15 (see FIG. 1B) that include the respective devices 13.

Figure 2:
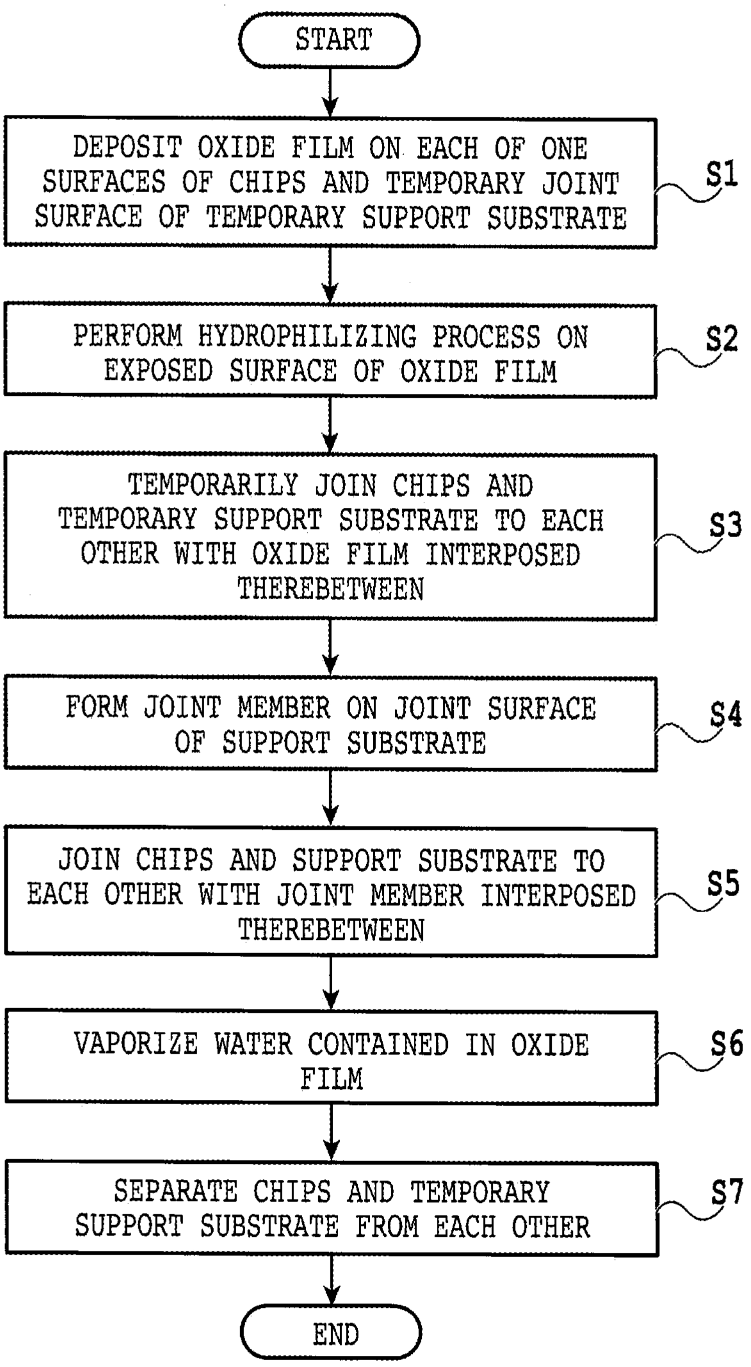
FIG. 2 is a flowchart illustrating by way of example the sequence of a method of manufacturing a laminated assembly including chips.

FIG. 2 is a flowchart illustrating by way of example the sequence of a method of manufacturing a laminated assembly including plate-shaped objects, specifically, chips 15. According to the method illustrated in FIG. 2, an oxide film is deposited on one surface of each the chips 15, i.e., a surface free of the device 13, and on a temporary joint surface of a temporary support substrate that is to be temporarily joined to the chips 15 (depositing step S1).

Figure 3A:
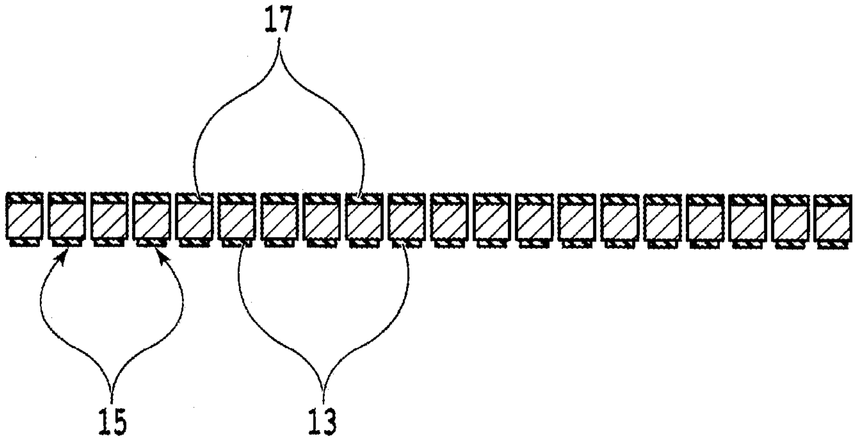
FIG. 3A is a cross-sectional view schematically illustrating a plurality of chips each with an oxide film deposited on one surface thereof.

FIG. 3A schematically illustrates, in cross section, the chips 15 each with the oxide film, denoted by 17, deposited on one surface thereof. The device 13 is disposed on another surface of the chip 15 that is opposite the one surface thereof. The oxide film 17 illustrated in FIG. 3A represents an oxide silicon film deposited according to a process of plasma enhanced chemical vapor deposition (PECVD), for example.

The oxide film 17 is deposited by keeping one surface of each of the chips 15 exposed in the internal space of a chamber, not depicted, supplying the internal space of the chamber with a gas generated by vaporizing a liquid material such as liquid tetraethyl orthosilicate (TEOS), and plasmatizing the gas in the internal space of the chamber.

The temperature of the atmosphere in which to deposit the oxide film 17, i.e., the temperature in the internal space of the chamber, is set to a value such that the deposited oxide film 17 will have a high water content. For example, the temperature in the internal space of the chamber is set to a value in a first temperature range from 80° C. to 300° C., preferably from 100° C. to 260° C., more preferably from 120° C. to 220° C., or most preferably from 120° C. to 180° C.

The oxide film 17 has a small film thickness in order to prevent the chips 15 from sinking toward the temporary support substrate when the chips 15 will be temporarily joined to the temporary support substrate, as described later. For example, the oxide film 17 has a thickness up to 1 μm, preferably up to 500 nm, or more preferably up to 250 nm, or most preferably up to 125 nm.

In order to planarize an exposed surface of the oxide film 17 that is remoter from the device 13, a planarizing process such as chemical mechanical polishing (CMP) may be performed on the exposed surface of the oxide film 17. Furthermore, after the oxide film 17 has been deposited to a film thickness in excess of 1 μm, the planarizing process may be performed on the exposed surface of the oxide film 17 to reduce the film thickness up to 1 μm, i.e., to make the film thickness equal to or less than 1 μm and also to planarize the exposed surface of the oxide film 17. In addition, the planarizing process may be performed on the one surface of each of the chips 15 before the oxide film 17 is deposited thereon.

Figure 3B:
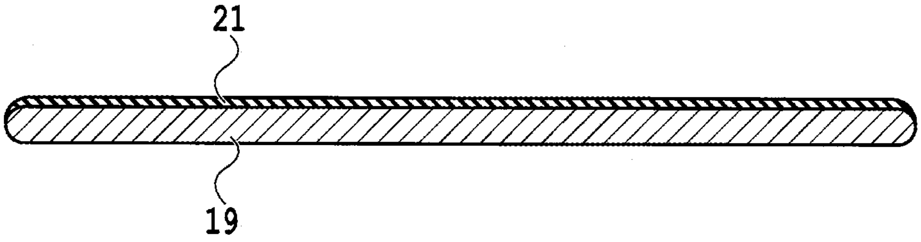
FIG. 3B is a cross-sectional view schematically illustrating a temporary support substrate with an oxide film deposited on a temporary joint surface thereof.

FIG. 3B schematically illustrates, in cross section, a temporary support substrate 19 having a temporary joint surface with an oxide film 21 deposited thereon. The temporary support substrate 19 illustrated in FIG. 3B is, for example, a structural object identical to the wafer 11 illustrated in FIG. 1A except that it is free of the devices 13.

Alternatively, the temporary support substrate 19 may be a substrate made of an insulating material such as glass, for example. The temporary support substrate 19 may be thicker and/or larger in diameter than the wafer 11 illustrated in FIG. 1A.

The oxide film 21 illustrated in FIG. 3B represents an oxide silicon film deposited according to the same process as the oxide film 17 illustrated in FIG. 3A, for example. A planarizing process may be performed on an exposed surface of the oxide film 21 and/or the temporary joint surface of the temporary support substrate 19 before the oxide film 21 is deposited thereon.

Figure 4A:
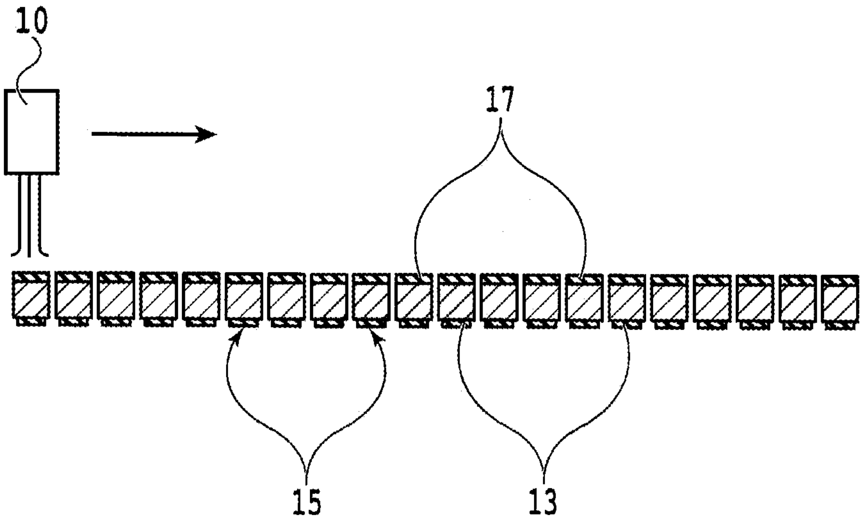
FIG. 4A is a cross-sectional view schematically illustrating the manner in which a hydrophilizing process is performed on an exposed surface of the oxide film deposited on the one surface of each of the chips.
Figure 4B:
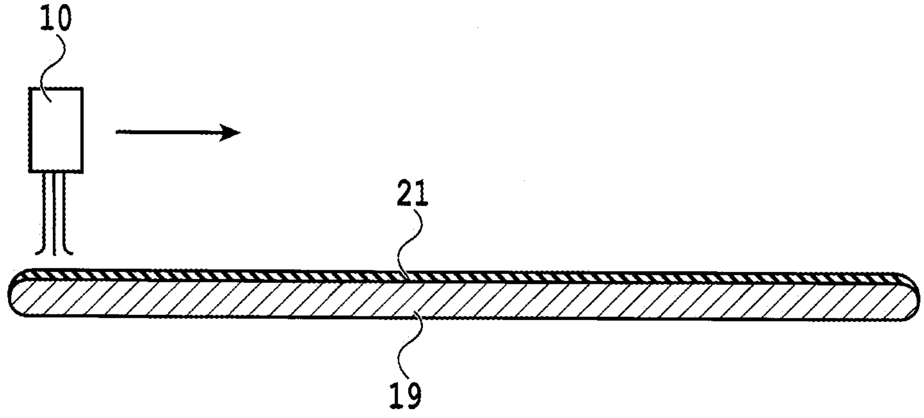
FIG. 4B is a cross-sectional view schematically illustrating the manner in which the hydrophilizing process is performed on an exposed surface of the oxide film deposited on the temporary joint surface of the temporary support substrate.

After depositing step S1, a hydrophilizing process is performed on the exposed surfaces of the oxide films 17 and 21 (hydrophilizing step S2). FIG. 4A schematically illustrates, in cross section, the manner in which the hydrophilizing process is performed on the exposed surface of each of the oxide films 17, and FIG. 4B schematically illustrates, in cross section, the manner in which the hydrophilizing process is performed on the exposed surface of the oxide film 21.

The hydrophilizing process refers to a process for forming OH groups on the exposed surfaces of the oxide films 17 and 21 to activate the exposed surfaces. For example, the hydrophilizing process is carried out by irradiating the exposed surfaces of the oxide films 17 and 21 with a nitrogen plasma or ultraviolet radiation under the atmospheric pressure.

When the hydrophilizing process is performed, it is preferable that water contained in the oxide films 17 and 21 be not vaporized. Accordingly, the temperature of the atmosphere in which to perform the hydrophilizing process is set to a value lower than the temperature of the atmosphere in which to deposit the oxide films 17 and 21, e.g., to the room temperature.

Figure 5A:
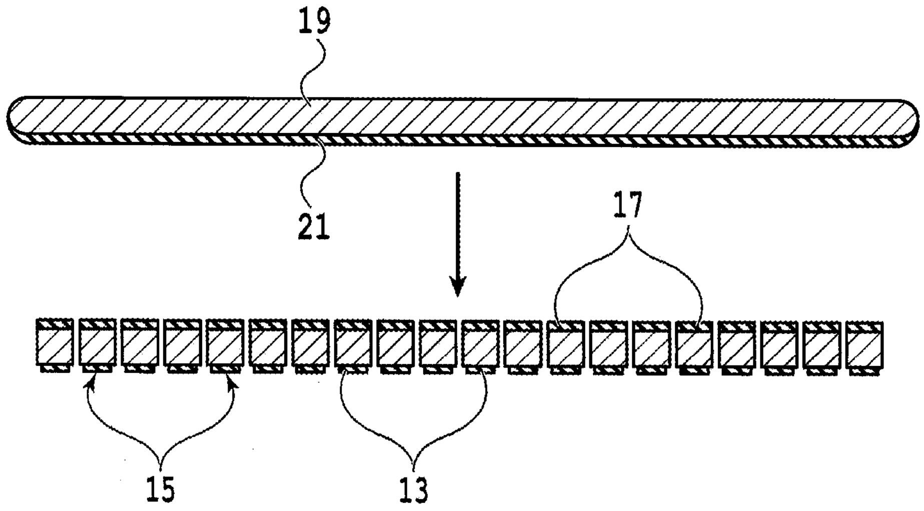
FIG. 5A is a cross-sectional view schematically illustrating the manner in which the chips and the temporary support substrate are temporarily joined to each other.
Figure 5B:
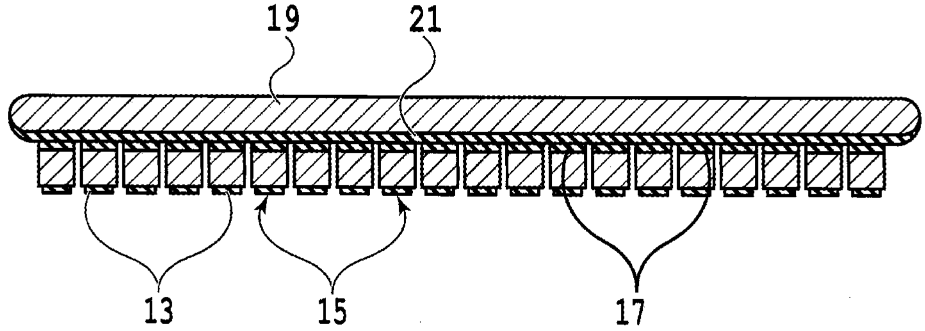
FIG. 5B is a cross-sectional view schematically illustrating the chips and the temporary support substrate that have been temporarily joined to each other.

After hydrophilizing step S2, the chips 15 and the temporary support substrate 19 are temporarily joined to each other by the oxide films 17 and 21 interposed therebetween (temporarily joining step S3). FIG. 5A schematically illustrates, in cross section, the manner in which the chips 15 and the temporary support substrate 19 are temporarily joined to each other, and FIG. 5B schematically illustrates, in cross section, the chips 15 and the temporary support substrate 19 that have been temporarily joined to each other.

For temporarily joining the chips 15 and the temporary support substrate 19 to each other, the one surface of each of the chips 15 and the temporary joint surface of the temporary support substrate 19 are placed in facing relation to each other with the oxide films 17 and 21 interposed therebetween. Then, the confronting surfaces of the chips 15 and the temporary support substrate 19 are brought closely to each other, for example, until a load of approximately 10 kN acts on the chips 15 and the temporary support substrate 19. As a result, a hydrogen bonding occurs between the oxide films 17 and 21, temporarily joining the chips 15 and the temporary support substrate 19.

The temporarily joining process may be carried out under the atmospheric pressure or in an evacuated atmosphere under the pressure of 105 Pa or lower. In addition, in order to accelerate the hydrogen bonding occurring between the oxide films 17 and 21, the exposed surfaces of the oxide films 17 and 21 may be supplied with water immediately before the chips 15 and the temporary support substrate 19 are temporarily joined to each other.

When the temporary joining process is carried out, it is preferable that water contained in the oxide films 17 and 21 be not vaporized. Accordingly, the temperature of the atmosphere in which to perform the temporary joining process is set to a value lower than the temperature of the atmosphere in which to deposit the oxide films 17 and 21, e.g., to the room temperature.

Figure 6:
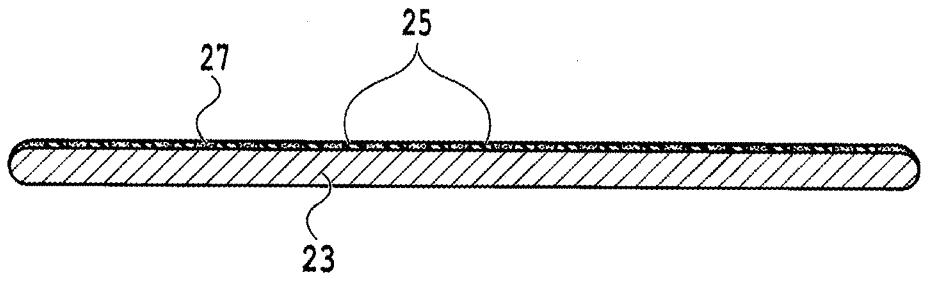
FIG. 6 is a cross-sectional view schematically illustrating a support substrate with a joint member formed on a joint surface thereof.

After temporary joining step S3, a joint member is formed on a joint surface of a support substrate that is to be joined to the chips 15 (joint member forming step S4). FIG. 6 schematically illustrates, in cross section, a support substrate 23 with a joint member 27 formed on a joint surface thereof.

The support substrate 23 illustrated in FIG. 6 refers to a wafer, for example, made of a semiconductor material such as monocrystalline silicon and having the same shape as the wafer 11 illustrated in FIG. 1A. A plurality of devices 25 to be connected respectively to the devices 13 included in the respective chips 15 are constructed on the joint surface of the support substrate 23. However, the devices 25 are not necessarily indispensable but may be dispensed with.

The joint member 27 illustrated in FIG. 6 is formed on the support substrate 23 by, for example, depositing an oxide silicon film on the joint surface of the support substrate 23 in the same manner as with the oxide film 17 illustrated in FIG. 3A and thereafter performing a planarizing process such as CMP, for example, on the exposed surface of the deposited oxide silicon film until the devices 25 are exposed. The oxide silicon film thus planarized becomes the joint member 27. The temperature of the atmosphere in which to deposit the oxide silicon film is set to a value, e.g., a value in excess of 350° C., such that the deposited oxide silicon film will have a low water content.

Alternatively, the joint member 27 may be made of an organic adhesive containing benzocyclobutene (BCB), for example. In this case, the joint member 27 may be formed by coating the joint surface of the support substrate 23 with an organic adhesive while keeping the devices 25 exposed in an atmosphere at the room temperature and then prebaking, i.e., softly baking, the organic adhesive in an atmosphere at a temperature of approximately 170° C., for example.

Figure 7A:
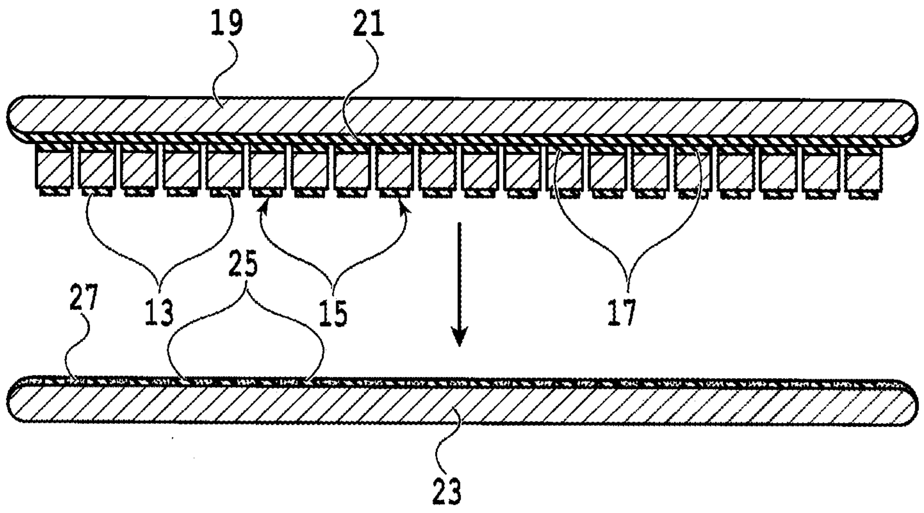
FIG. 7A is a cross-sectional view schematically illustrating the manner in which the chips and the support substrate are joined to each other.
Figure 7B:
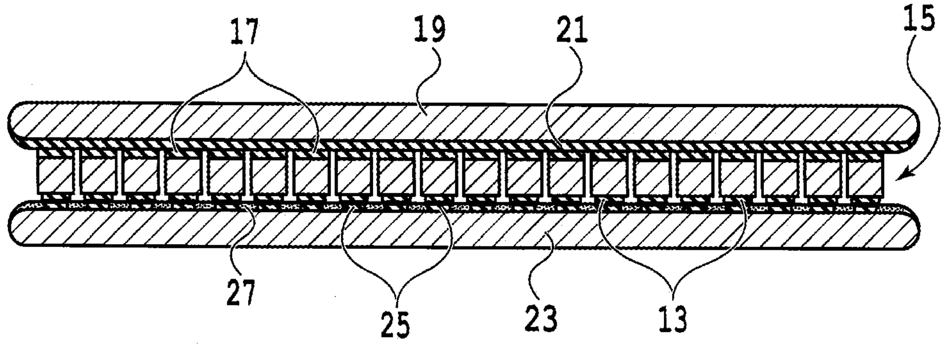
FIG. 7B is a cross-sectional view schematically illustrating the chips and the support substrate that have been joined to each other.

After joint member forming step S4, the chips 15 and the support substrate 23 are joined to each other by the joint member 27 (joining step S5). FIG. 7A schematically illustrates, in cross section, the manner in which the chips 15 and the support substrate 23 are joined to each other, and FIG. 7B schematically illustrates, in cross section, the chips 15 and the support substrate 23 that have been joined to each other.

Providing the joint member 27 is in the form of an oxide silicon film, it is necessary to perform the hydrophilizing process on the exposed surface of the joint member 27 after joint member forming step S4 and before joining step S5. Immediately before joining step S5, the other surfaces of the respective chips 15 and/or the joint surface of the support substrate 23 may be cleaned.

For joining the chips 15 and the support substrate 23 to each other, the other surfaces of the chips 15 and the joint surface of the support substrate 23 are placed in facing relation to each other. Then, the confronting surfaces of the chips 15 and the support substrate 23 are brought closely to and pressed against each other with this state maintained, for example, until a load of approximately 10 kN acts on the chips 15 and the support substrate 23. As a result, the chips 15 and the joint member 27 on the support substrate 23 are joined to each other.

The joining process may be carried out under the atmospheric pressure or in an evacuated atmosphere under the pressure of 105 Pa or lower. In addition, in a case where the joint member 27 is in the form of an oxide silicon film, in order to accelerate the hydrogen bonding occurring between the chips 15 and the joint member 27, the other surfaces of the chips 15 and/or the exposed surface of the joint member 27 may be supplied with water immediately before the chips 15 and the support substrate 23 are joined to each other.

If the joint member 27 is made of an organic adhesive, then the temperature of the atmosphere in which to join the chips 15 and the support substrate 23 to each other is set to a value capable of curing the joint member 27, e.g., a value of approximately 300° C. If interconnects, e.g., interconnects of copper (Cu), included in the devices 13 and interconnects, e.g., interconnects of Cu, included in the devices 25 are to be directly connected to each other in joining step S5, i.e., if a hybrid bonding is to be formed, then the temperature of the atmosphere in which to join the chips 15 and the support substrate 23 to each other may be set to a value ranging from 250° C. to 350° C., for example.

Figure 8:
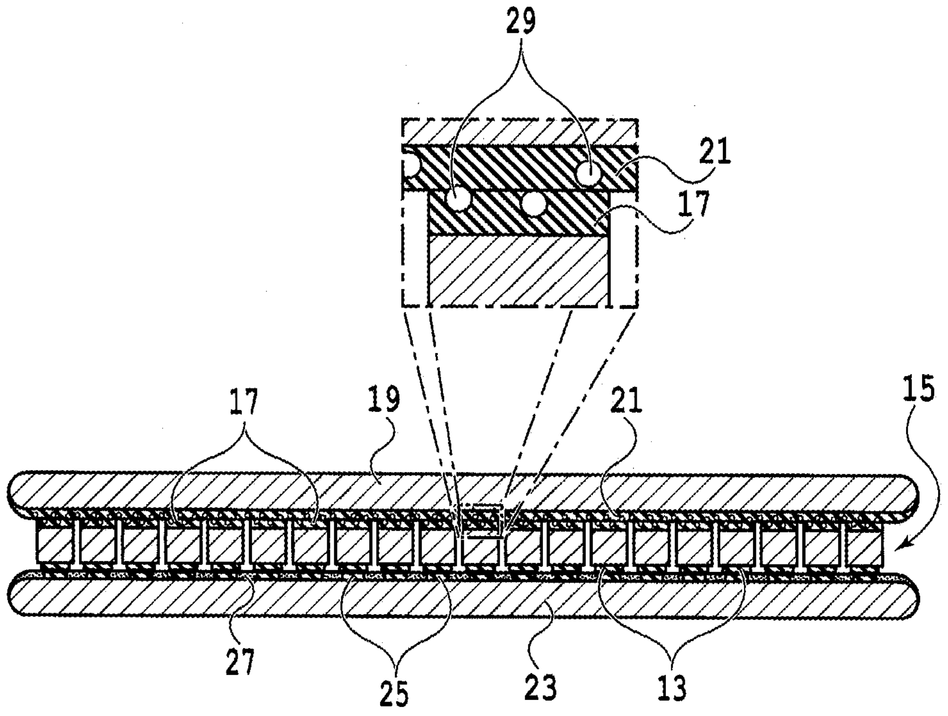
FIG. 8 is a cross-sectional view schematically illustrating a laminated assembly including the chips, the temporary support substrate, and the support substrate after water contained in the oxide films has been vaporized.

After joining step S5, water contained in the oxide films 17 and 21 is vaporized (vaporizing step S6). FIG. 8 schematically illustrates, in cross section, a laminated assembly including the chips 15, the temporary support substrate 19, and the support substrate 23 after the water contained in the oxide films 17 and 21 has been vaporized.

In vaporizing step S6, the laminated assembly is heated in a nitrogen atmosphere by a heat treatment apparatus including an infrared lamp, for example. As illustrated in FIG. 8, when the laminated assembly is heated, a number of voids 29 are formed in the oxide films 17 and 21. The voids 29 will act as separation initiating points where the temporary support substrate 19 starts to be separated from the chips 15.

In order to vaporize the water contained in the oxide films 17 and 21, it is necessary to make the temperature of the atmosphere higher than when the oxide films 17 and 21 are deposited. However, if the temperature of the atmosphere in which to heat the laminated assembly is too high, then a siloxane bonding stronger than the hydrogen bonding may possibly occur between the oxide films 17 and 21.

Consequently, the temperature of the atmosphere in which to heat the laminated assembly is set to a value in a second temperature range from 200° C. to 350° C., preferably from 215° C. to 320° C., more preferably from 230° C. to 290° C., or most preferably from 245° C. to 260° C.

If the joint member 27 is made of an organic adhesive, i.e., if the temperature of the environment in joining step S5 is set to approximately 300° C., for example, then joining step S5 and the vaporizing step S6 may be carried out uninterruptedly in succession.

Figure 9:
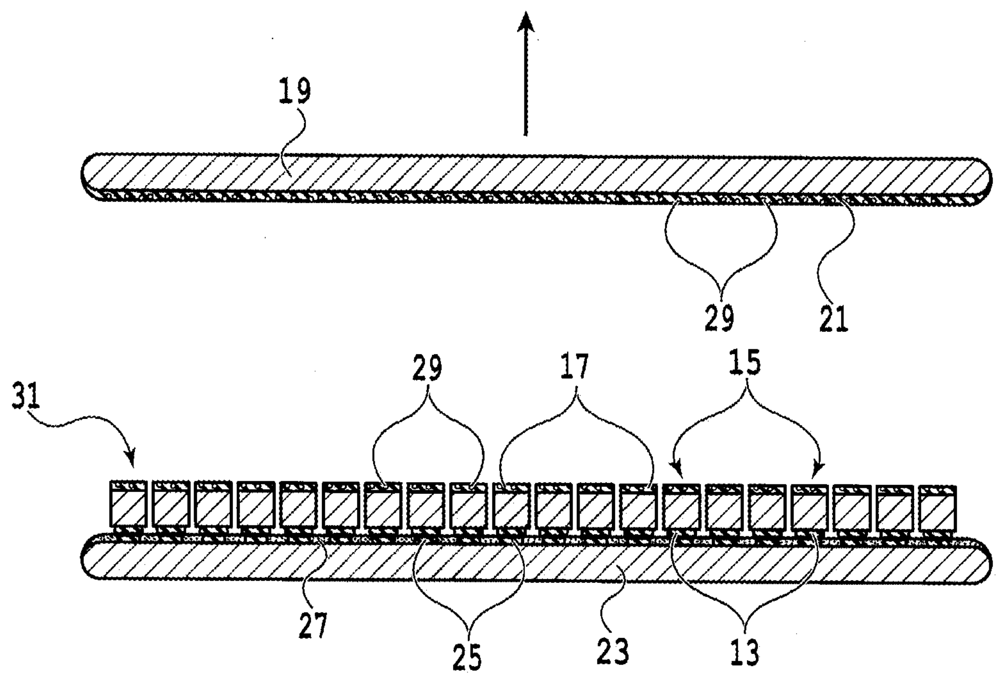
FIG. 9 is a cross-sectional view schematically illustrating the manner in which the temporary support substrate is separated from the chips.

After vaporizing step S6, the chips 15 and the temporary support substrate 19 are separated from each other (separating step S7). FIG. 9 schematically illustrates, in cross section, the manner in which the temporary support substrate 19 is separated from the chips 15.

In separating step S7, an external force for separating the temporary support substrate 19 from the chips 15 is applied to the temporary support substrate 19 and/or the support substrate 23. As a result, the temporary support substrate 19 is separated from the chips 15, fabricating a laminated assembly 31 that includes the chips 15 and the support substrate 23.

Furthermore, the laminated assembly 31 may be etched to remove the oxide film 17 that remains on the one surfaces of the chips 15 after the temporary support substrate 19 has been separated from the chips 15. In addition, the laminated assembly 31 may be divided into individual pieces along the boundaries between the chips 15.

According to the method of manufacturing a laminated assembly as illustrated in FIG. 2, the chips 15 and the temporary support substrate 19 are temporarily joined to each other using the oxide films 17 and 21 whose exposed surfaces have been hydrophilized. According to the method, in other words, the chips 15 and the temporary support substrate 19 are temporarily joined to each other using the hydrogen bonding that occurs between the exposed surfaces of the oxide films 17 and 21.

According to the method, after the joining of the chips 15 and the support substrate 23 has been completed, water contained in the oxide films 17 and 21 is vaporized by keeping the temperature of the atmosphere in the second temperature range that is higher than the first temperature range for the temperature of the atmosphere in which to deposit the oxide films 17 and 21. The vaporization of water produces a number of voids 29 in the oxide films 17 and 21 that will act as separation initiating points where the temporary support substrate 19 starts to be separated from the chips 15. As a consequence, the method makes it easy to separate the temporary support substrate 19 from the chips 15.

The embodiment described above represents an aspect of the present invention, and the present invention is in no way limited to the details of the above embodiment. Various changes and modifications may be made in the above embodiment. For example, in depositing step S1, either the one surfaces of the chips 15 or the temporary joint surface of the temporary support substrate 19 may be deposited with the corresponding one of the oxide films 17 and 21. In other words, according to the present invention, either one of the oxide films 17 or 21 may be dispensed with.

In depositing step S1, the oxide film 17 may be deposited on the surface of each of the chips 15 where the device 13 is present. In other words, the surface of each of the chips 15 where the device 13 is present may be joined to the temporary support substrate 19, and the surface of each of the chips 15 that is free of the device 13 may be joined to the support substrate 23. In this case, the joint surface of the support substrate 23 may be free of the devices 25.

In depositing step S1, the oxide film 17 may be deposited on one surface, e.g., the reverse side 11*b*, of the wafer 11 before the wafer 11 is divided into the chips 15. In this case, the chips 15 may be produced by dividing the wafer 11 along the boundaries between the devices 13 after depositing step S1 and before hydrophilizing step S2.

According to the present invention, joint member forming step S4 may be performed anytime before joining step S5. For example, joint member forming step S4 may be performed before depositing step S1.

In joint member forming step S4 before depositing step S1, a joint member that is similar to the joint member 27 in the form of the oxide silicon film described above may be formed on the other surface of a plate-shaped object, i.e., each of the chips 15 or the wafer 11 prior to being divided into the chips 15.

Stated otherwise, a joint member may be formed on not only the joint surface of the support substrate 23, but also the other surface of the plate-shaped object. Alternatively, a joint member may not be formed on the joint surface of the support substrate 23, but may be formed on only the other surface of the plate-shaped object.

Figure 10:
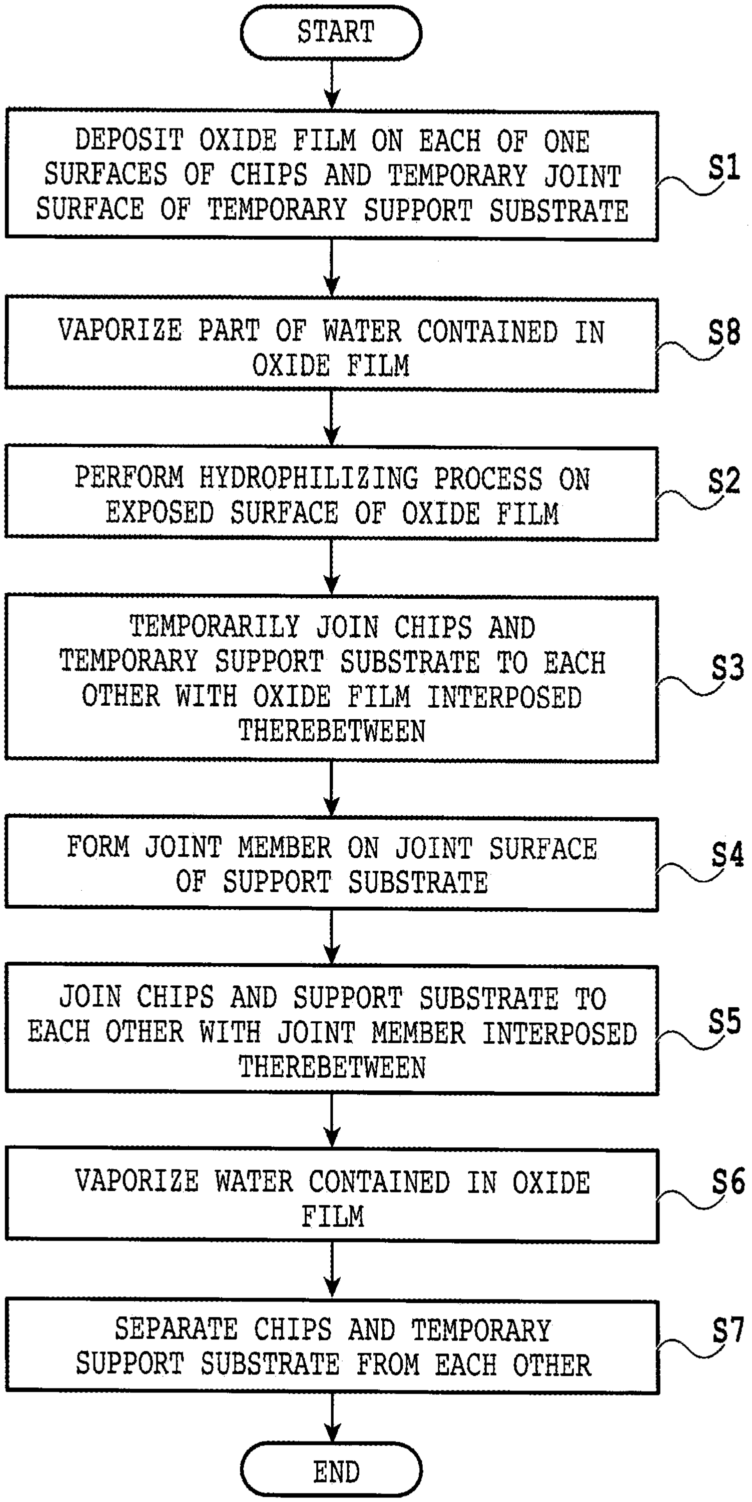
FIG. 10 is a flowchart illustrating by way of example the sequence of a method of manufacturing a laminated assembly that is different from the method of manufacturing a laminated assembly illustrated in FIG. 2.

The method of manufacturing a laminated assembly according to the present invention may include a step other than the steps illustrated in FIG. 2. FIG. 10 is a flowchart illustrating by way of example the sequence of a method of manufacturing a laminated assembly that is different from the method of manufacturing a laminated assembly illustrated in FIG. 2. Specifically, according to the method illustrated in FIG. 10, after depositing step S1 and before hydrophilizing step S2, part of the water contained in the oxide films 17 and 21 is vaporized (preliminary vaporizing step S8).

In preliminarily vaporizing step S8, in order to reduce the amount of water contained in the oxide films 17 and 21, the plate-shaped objects each with the oxide film 17 deposited on one surface thereof and/or the temporary support substrate 19 with the oxide film 21 deposited on the temporary joint surface is heated in a nitrogen atmosphere by a heat treatment apparatus including an infrared lamp, for example.

In order to vaporize the water contained in the oxide films 17 and 21, it is necessary to make the temperature of the atmosphere higher than when the oxide films 17 and 21 are deposited. However, if the temperature of the atmosphere in which to heat the laminated assembly is too high, then water contained in the oxide films 17 and 21 may possibly be vaporized in its entirety. Therefore, the temperature of the atmosphere in which to heat the plate-shaped objects and/or the temporary support substrate 19 is set to a value in a third temperature range that is higher than the first temperature range and lower than the second temperature range.

According to the present invention, furthermore, the wafer 11 may be referred to as a plate-shaped object that is temporarily joined to the temporary support substrate 19 and that is joined to the support substrate 23. In other words, according to the present invention, the chips 15 fabricated from the wafer 11 may not be joined to the support substrate 23, but the wafer 11 itself may be joined to the support substrate 23. In this case, the devices 13 may not be constructed on the wafer 11.

The structural and methodological details according to the above embodiment may be changed or modified without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of manufacturing a laminated assembly including a plate-shaped object having one surface and another surface positioned opposite the one surface, the method comprising:

a depositing step of depositing an oxide film on at least one of the one surface of the plate-shaped object or a temporary joint surface of a temporary support substrate in an atmosphere whose temperature is kept in a first temperature range;

after the depositing step, a hydrophilizing step of performing a hydrophilizing process on an exposed surface of the oxide film;

after the hydrophilizing step, a temporarily joining step of temporarily joining the plate-shaped object and the temporary support substrate with the oxide film interposed therebetween by placing the one surface of the plate-shaped object and the temporary joint surface of the temporary support substrate in facing relation to each other with the oxide film interposed therebetween and bringing the confronting surfaces of the plate-shaped object and the temporary support substrate closely to each other;

a joint member forming step of forming a joint member on at least one of the other surface of the plate-shaped object or a joint surface of a support substrate;

after the temporarily joining step and the joint member forming step, a joining step of joining the plate-shaped object and the support substrate to each other with the joint member interposed therebetween by placing the other surface of the plate-shaped object and the joint surface of the support substrate in facing relation to each other with the joint member interposed therebetween and bringing the confronting surfaces of the plate-shaped object and the support substrate closely to each other;

after the joining step, a vaporizing step of vaporizing water contained in the oxide film in an atmosphere whose temperature is kept in a second temperature range higher than the first temperature range; and after the vaporizing step, a separating step of separating the plate-shaped object and the temporary support substrate from each other.

2. The method of manufacturing a laminated assembly according to claim 1, wherein the first temperature range is a temperature range from 80° C. to 300° C.

3. The method of manufacturing a laminated assembly according to claim 1, wherein the second temperature range is a temperature range from 200° C. to 350° C.

4. The method of manufacturing a laminated Assembly according to claim 1, further comprising:

after the depositing step and before the hydrophilizing step, a preliminarily vaporizing step of vaporizing part of the water contained in the oxide film in an atmosphere whose temperature is kept in a third temperature range that is higher than the first temperature range and lower than the second temperature range.

5. The method of manufacturing a laminated assembly according to claim 1, wherein the oxide film has a thickness up to 1 μm.

* * * * *